United States Patent
Wang et al.

(10) Patent No.: US 11,686,866 B2
(45) Date of Patent: Jun. 27, 2023

(54) RADIATION SENSING DEVICE

(71) Applicant: InnoLux Corporation, Miao-Li County (TW)

(72) Inventors: Zhi-Hong Wang, Miao-Li County (TW); Hsin-Hung Lin, Miao-Li County (TW); Chih-Hao Wu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 17/379,969

(22) Filed: Jul. 19, 2021

(65) Prior Publication Data

US 2021/0349222 A1 Nov. 11, 2021

Related U.S. Application Data

(62) Division of application No. 15/930,452, filed on May 13, 2020, now Pat. No. 11,099,284.

(30) Foreign Application Priority Data

May 22, 2019 (CN) .......................... 201910431245.2

(51) Int. Cl.
*G01T 1/24* (2006.01)
*H01L 27/146* (2006.01)

(52) U.S. Cl.
CPC .............. *G01T 1/241* (2013.01); *G01T 1/247* (2013.01); *H01L 27/14614* (2013.01)

(58) Field of Classification Search
CPC ..... G01T 1/241; G01T 1/247; H01L 27/14614
See application file for complete search history.

(56) References Cited

U.S. PATENT DOCUMENTS

| | | | | |
|---|---|---|---|---|
| 4,047,038 | A * | 9/1977 | Kompelien | G01T 1/18 250/372 |
| 2006/0237656 | A1* | 10/2006 | Ishii | G01T 1/2928 250/370.14 |
| 2015/0021594 | A1* | 1/2015 | Yamada | H01L 27/14658 257/66 |
| 2019/0187300 | A1* | 6/2019 | Kim | G01T 1/20 |

* cited by examiner

*Primary Examiner* — Blake C Riddick
(74) *Attorney, Agent, or Firm* — Winston Hsu

(57) ABSTRACT

A radiation sensing device is provided in the present disclosure. The radiation sensing device includes a substrate and a plurality of semiconductor units. The semiconductor units are disposed on the substrate, and at least one of the semiconductor units includes a first gate electrode, an active layer, and a second gate electrode. The active layer is disposed on the first gate electrode, and the second gate electrode is disposed on the active layer. The second gate electrode has a positive bias voltage during a standby mode. The second electrode may be configured to have a positive bias voltage during the standby mode for improving influence on electrical properties of the semiconductor unit after the semiconductor unit is irradiated by radiation.

7 Claims, 9 Drawing Sheets

RADIATION SENSING DEVICE

CROSS REFERENCE TO RELATED APPLICATIONS

This application is a division of application Ser. No. 15/930,452 filed on May 13, 2020, now allowed, which is incorporated by reference herein in its entirety.

BACKGROUND OF THE DISCLOSURE

1. Field of the Disclosure

The present disclosure relates to a radiation sensing device and an operation method thereof, and more particularly, to a radiation sensing device including semiconductor units and an operation method thereof.

2. Description of the Prior Art

Light sensing technology has been applied in many electronic products and inspection equipment with the related development, and the light sensing technology capable of detecting radiation (such as X-ray) is one of the applications that has received considerable attention. Because of properties such as low irradiation dose, fast electronic imaging, and convenience of viewing, copying, capturing, transferring, and analyzing electronic images, the traditional approach using films for detecting radiation has been gradually replaced by the digital radiation sensing device, and the digital radiation sensing device has become the current trend of development of digital medical imaging. In the general digital radiation sensing device, light sensing units are used to receive radiation energy and covert the radiation energy into electrical signals, and semiconductor switching units are used to control the reading of the signals. However, by the influence of the energy and/or the dose of the radiation during the irradiation, properties of stacked layers in the semiconductor switching units (such as a semiconductor channel layer, a gate dielectric layer, and/or a channel passivation layer) may change, and the electrical performance of the semiconductor switching units may be influenced accordingly. For instance, negative shift in the threshold voltage (Vth) of the semiconductor switching units may be generated, and there may be problems such as operation failure of the radiation sensing device accordingly.

SUMMARY OF THE DISCLOSURE

It is one of the objectives of the present disclosure to provide a radiation sensing device and an operation method thereof. A second gate electrode has a positive bias voltage during a standby mode for recovering influence on electrical properties of a semiconductor unit after the semiconductor unit is irradiated by radiation. The electrical performance of the semiconductor unit may be recovered to be normal, the influence of the radiation on the normal operation of the radiation sensing device may be avoided, and the lifetime of the radiation sensing device may be extended accordingly.

A radiation sensing device is provided in an embodiment of the present disclosure. The radiation sensing device includes a substrate and a plurality of semiconductor units. At least one of the semiconductor units is disposed on the substrate, and the semiconductor unit includes a first gate electrode, an active layer, and a second gate electrode. The active layer is disposed on the first gate electrode, and the second gate electrode is disposed on the active layer. The second gate electrode has a positive bias voltage during a standby mode.

An operation method of a radiation sensing device is provided in an embodiment of the present disclosure. The operation method includes the following steps. A radiation sensing device is provided. The radiation sensing device includes a substrate and semiconductor units disposed on the substrate. At least one of the semiconductor units includes a first gate electrode, an active layer, and a second gate electrode. The active layer is disposed on the first gate electrode. The second gate electrode is disposed on the active layer. The radiation sensing device is put into a standby mode, and the second gate electrode has a positive bias voltage during the standby mode.

These and other objectives of the present disclosure will no doubt become obvious to those of ordinary skill in the art after reading the following detailed description of the embodiment that is illustrated in the various figures and drawings.

DETAILED DESCRIPTION

Certain terms are used throughout the description and following claims to refer to particular components. As one skilled in the art will understand, equipment manufacturers may refer to a component by different names. This disclosure does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods. The use of these ordinal numbers is only used to make a claimed element with a certain name clear from another claimed element with the same name.

It should be understood that embodiments are described below to illustrate different technical features, but these technical features may be mixed to be used or combined with one another in different ways without conflicting with one another.

Figure 1:
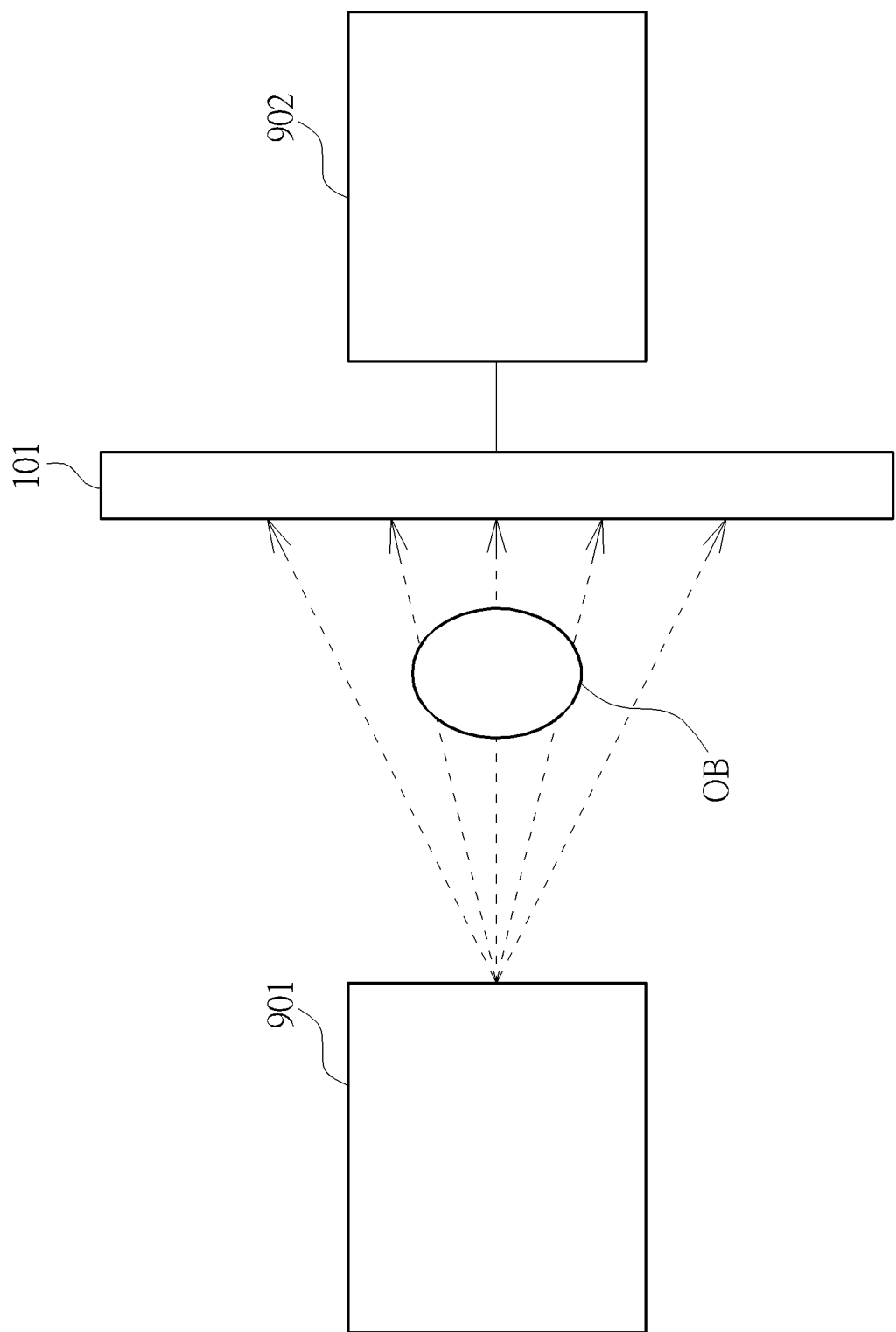
FIG. 1 is a schematic drawing illustrating a radiation system according to an embodiment of the present disclosure.
Figure 2:
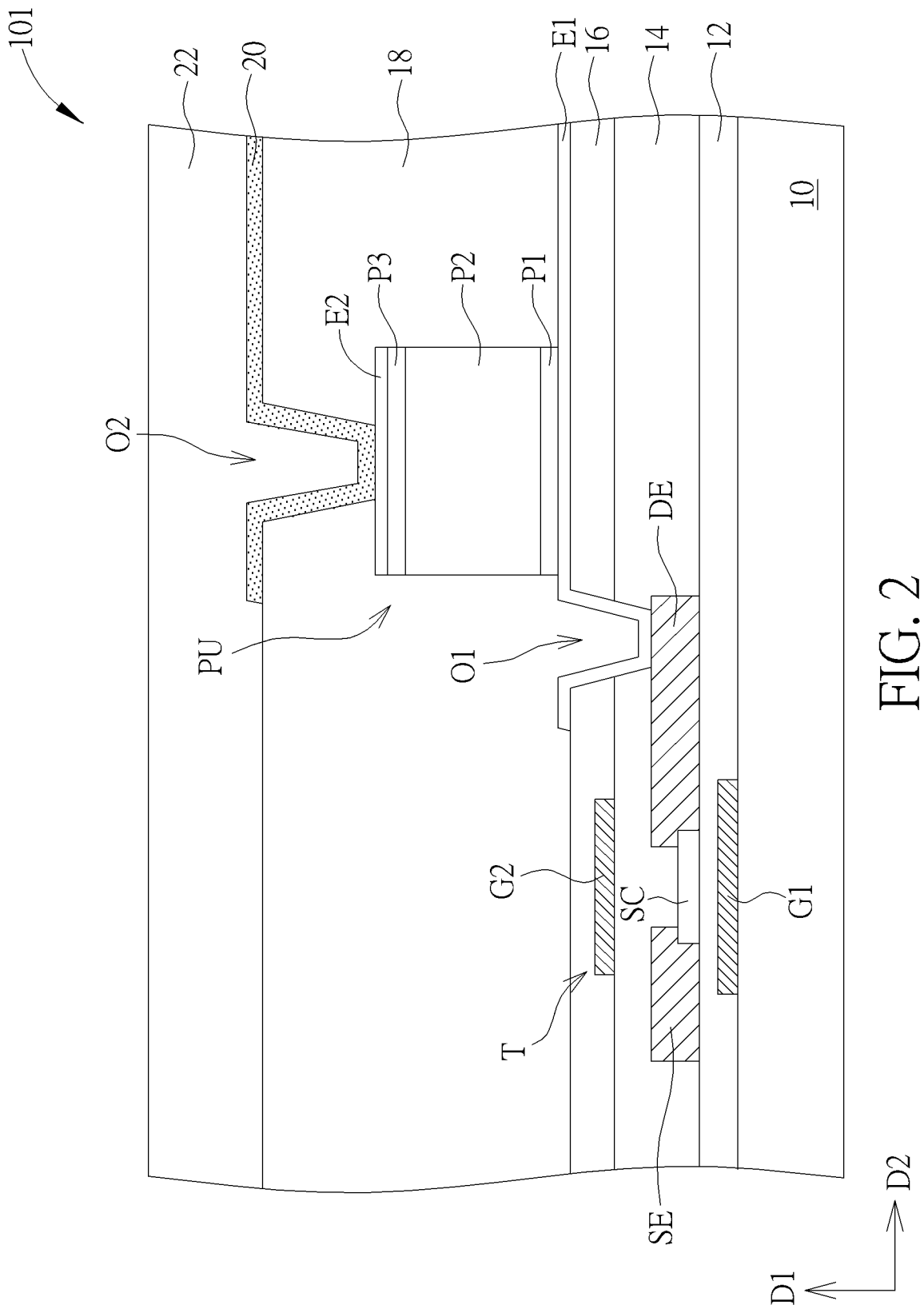
FIG. 2 is a schematic diagram illustrating a part of a radiation sensing device according to a first embodiment of the present disclosure.

Please refer to FIG. 1 and FIG. 2. FIG. 1 is a schematic drawing illustrating a radiation system according to an embodiment of the present disclosure, and FIG. 2 is a schematic diagram illustrating a part of a radiation sensing device 101 according to a first embodiment of the present disclosure. As shown in FIG. 1, in some embodiments, an object OB (such as human or other creatures or non-creatures) may be located between a radiation generating device 901 and the radiation sensing device 101. Radiation may be generated by the radiation generating device 901 to the object OB, and the radiation sensing device 101 located behind the object OB is used to perform radiation sensing. The radiation sensing device 101 may convert the received radiation energy into electrical signals, and a processor device 902 (such as a computer device) connected with the radiation sensing device 101 may perform signal processing to generate a corresponding radiation image accordingly.

Figure 3C:
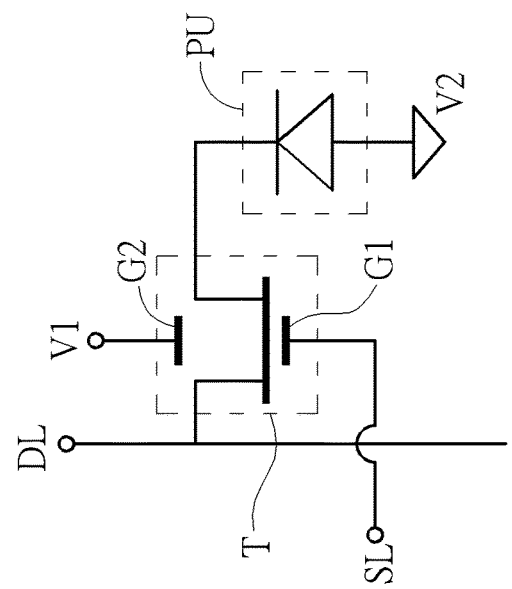
FIG. 3($a$), FIG. 3($b$), and FIG. 3($c$) are schematic circuit diagrams of a part of the radiation sensing device according to the first embodiment of the present disclosure.
Figure 3B:
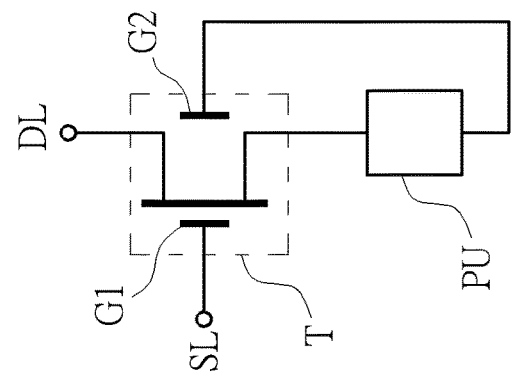
Figure 3A:
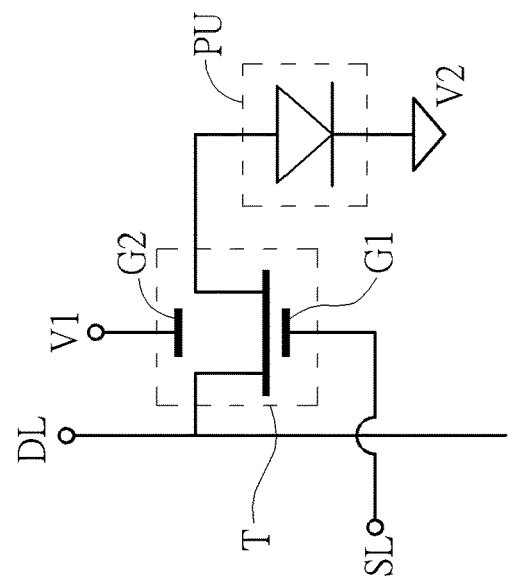

Please refer to FIG. 2, FIG. 3(a), FIG. 3(b), and FIG. 3(c). FIG. 2 is a schematic diagram illustrating a part of the radiation sensing device 101 according to the first embodiment, and FIG. 3(a), FIG. 3(b), and FIG. 3(c) are schematic circuit diagrams of a part of the radiation sensing device 101 according to the first embodiment. As shown in FIG. 2, the radiation sensing device 101 in this embodiment may include a substrate 10 and a plurality of semiconductor units T. However, to concisely explain technical features of the present disclosure, there is only one semiconductor unit T illustrated in the drawings of the present disclosure. The semiconductor units T are disposed on the substrate 10, and at least one of the semiconductor units T includes a first gate electrode G1, an active layer SC, and a second gate electrode G2. The active layer SC is disposed on the first gate electrode G1, and the second gate electrode G2 is disposed on the active layer SC. Specifically, in some embodiments, the semiconductor unit T may further include a gate dielectric layer 12, a source electrode SE, and a drain electrode DE. The gate dielectric layer 12 may be disposed between the first gate electrode G1 and the active layer SC, and the source electrode SE and the drain electrode DE may be disposed on the active layer SC and the gate dielectric layer 12, but not limited thereto. In addition, the radiation sensing device 101 may further include a protection layer 14 disposed on the source electrode SE, the drain electrode DE, and the active layer SC, and the second gate electrode G2 may be disposed on the protection layer 14. In some embodiments, the protection layer 14 may be regarded as a passivation layer or a channel passivation layer, but not limited thereto.

In some embodiments, the radiation sensing device 101 may further include at least one light sensing unit PU disposed on the substrate 10, and the light sensing unit PU may include a photodiode, a capacitor structure, or other suitable photoelectric conversion unit. For example, the light sensing unit PU may include a first semiconductor layer P1, an intrinsic semiconductor layer P2, and a second semiconductor layer P3 disposed in a direction perpendicular to a surface of the substrate 10 (such as a first direction D1), and the intrinsic semiconductor layer P2 may be sandwiched between the first semiconductor layer P1 and the second semiconductor layer P2 accordingly. The first semiconductor layer P1 may be electrically connected with a first terminal electrode E1, and the second semiconductor layer P3 may be electrically connected with a second terminal electrode E2.

As shown in FIG. 2, in some embodiments, the radiation sensing device 101 may further include a first insulation layer 16, a second insulation layer 18, a first electrically conductive layer 20, and a third insulation layer 22. The first insulation layer 16 may be disposed on the second gate electrode G2 and the protection layer 14, the first terminal electrode E1 described above may be disposed on the first insulation layer 16, the first terminal electrode E1 may be electrically connected with the drain electrode DE via an opening O1, and the opening O1 may be formed with sidewalls of the protection layer 14 and the first insulation layer 16 above the drain electrode DE, but not limited thereto. The second insulation layer 18 may be disposed on the first insulation layer 16, and the second insulation layer 18 may be disposed on the first terminal electrode E1, the light sensing unit PU, and the second terminal electrode E2 also. The first electrically conductive layer 20 may be disposed on the second insulation layer 18, and the first electrically conductive layer 20 may be electrically connected with the light sensing unit PU and the second terminal electrode E2 for providing a reference voltage (such as a second voltage V2 shown in FIG. 3(a) and FIG. 3(c)) to the light sensing unit PU and the second terminal electrode E2 via an opening O2. The opening O2 may be formed with sidewalls of the second insulation layer 18 located above the light sensing unit PU, but not limited thereto. The third insulation layer 22 may be disposed on the first electrically conductive layer 20 and the second insulation layer 18.

In some embodiments, the substrate 10 may be a rigid substrate or a flexible substrate, and the material of the substrate 10 may include glass, plastic, ceramic materials, polyimide (PI), polyethylene terephthalate (PET), an arrangement combination of the above-mentioned materials, or other materials suitable for forming the substrate. The first gate electrode G1, the second gate electrode G2, the source electrode SE, the drain electrode DE, the first terminal electrode E1, the second terminal electrode E2, and the first electrically conductive layer 20 may respectively include electrically conductive materials, such as metallic conductive materials, transparent conductive materials, or other suitable types of electrically conductive materials. The metallic conductive materials described above may include at least one of aluminum, copper, silver, chromium, titanium, or molybdenum, a composed layer of the above-mentioned materials, or an alloy of the above-mentioned materials. The transparent conductive materials described above may include indium tin oxide (ITO), indium zinc oxide (IZO), aluminum zinc oxide (AZO), or other suitable transparent conductive materials. The materials of the gate dielectric layer 12, the protection layer 14, the first insulation layer 16, the second insulation layer 18, and the third insulation layer 22 described above may respectively include inorganic materials, such as silicon nitride, silicon oxide, silicon oxynitride, aluminum oxide ($Al_2O_3$), and hafnium oxide ($HfO_2$), organic materials, such as acrylic resin, or other suitable dielectric materials. In addition, the material of the active layer SC described above may include an amorphous silicon semiconductor material, a polysilicon semiconductor material, an organic semiconductor material, an oxide semiconductor material (such as indium gallium zinc oxide, IGZO), or other suitable semiconductor materials. It is worth noting that the radiation sensing device of the present disclosure is not limited to the structure shown in FIG. 2 and/or the material properties described above, and other suitable structures and/or materials may also be applied in the radiation sensing device of the present disclosure.

As shown in FIG. 2, FIG. 3(*a*), FIG. 3(*b*), and FIG. 3(*c*), the first gate electrode G1 of the semiconductor unit T may be connected to a scan line SL, the source electrode SE of the semiconductor unit T may be electrically connected to a data line DL, the drain electrode DE of the semiconductor unit T may be electrically connected with the light sensing unit PU, and another end of the light sensing unit PU may be connected to a reference voltage (such as a second voltage V2). It is worth noting that the connection condition of the source electrode SE and the connection condition of the drain electrode DE in the present disclosure may be replaced with each other. In other words, in some embodiments, the drain electrode DE may be electrically connected to the data line DL, and the source electrode SE may be electrically connected with the light sensing unit PU. In addition, the second gate electrode G2 is not electrically connected with the source electrode SE, the drain electrode DE, and the active layer SC. In some embodiments, as shown in FIG. 3(*a*), the second gate electrode G2 is not electrically connected with the light sensing unit PU. In some embodiments, as shown in FIG. 3(*b*), the second gate electrode G2 is electrically connected with the light sensing unit PU.

In some embodiments, the light sensing unit PU may be formed by an amorphous silicon (a-Si) deposition process. For example, the intrinsic semiconductor layer P2 may be an intrinsic amorphous silicon semiconductor layer, the first semiconductor layer P1 may be a P-type semiconductor layer (such as a P-type doped amorphous silicon semiconductor layer), the second semiconductor layer P3 may be an N-type semiconductor layer (such as a N-type doped amorphous silicon semiconductor layer), and the light sensing unit PU in this condition may be regarded as a PIN type photodiode (FIG. 3(*a*) may be the corresponding schematic circuit diagram). Additionally, in some embodiments, the first semiconductor layer P1 may be an N-type semiconductor layer (such as a N-type doped amorphous silicon semiconductor layer), the second semiconductor layer P3 may be a P-type semiconductor layer (such as a P-type doped amorphous silicon semiconductor layer), and the light sensing unit PU in this condition may be regarded as a NIP type photodiode (FIG. 3(*c*) may be the corresponding schematic circuit diagram), but not limited thereto. Additionally, in some embodiments, the radiation sensing device may include a plurality of the semiconductor units T and the corresponding light sensing units PU described above, the semiconductor units T and the corresponding light sensing units PU may be disposed and arranged in an array configuration, and the radiation sensing device may be regarded as an active matrix radiation sensing panel, but not limited thereto.

Figure 4:
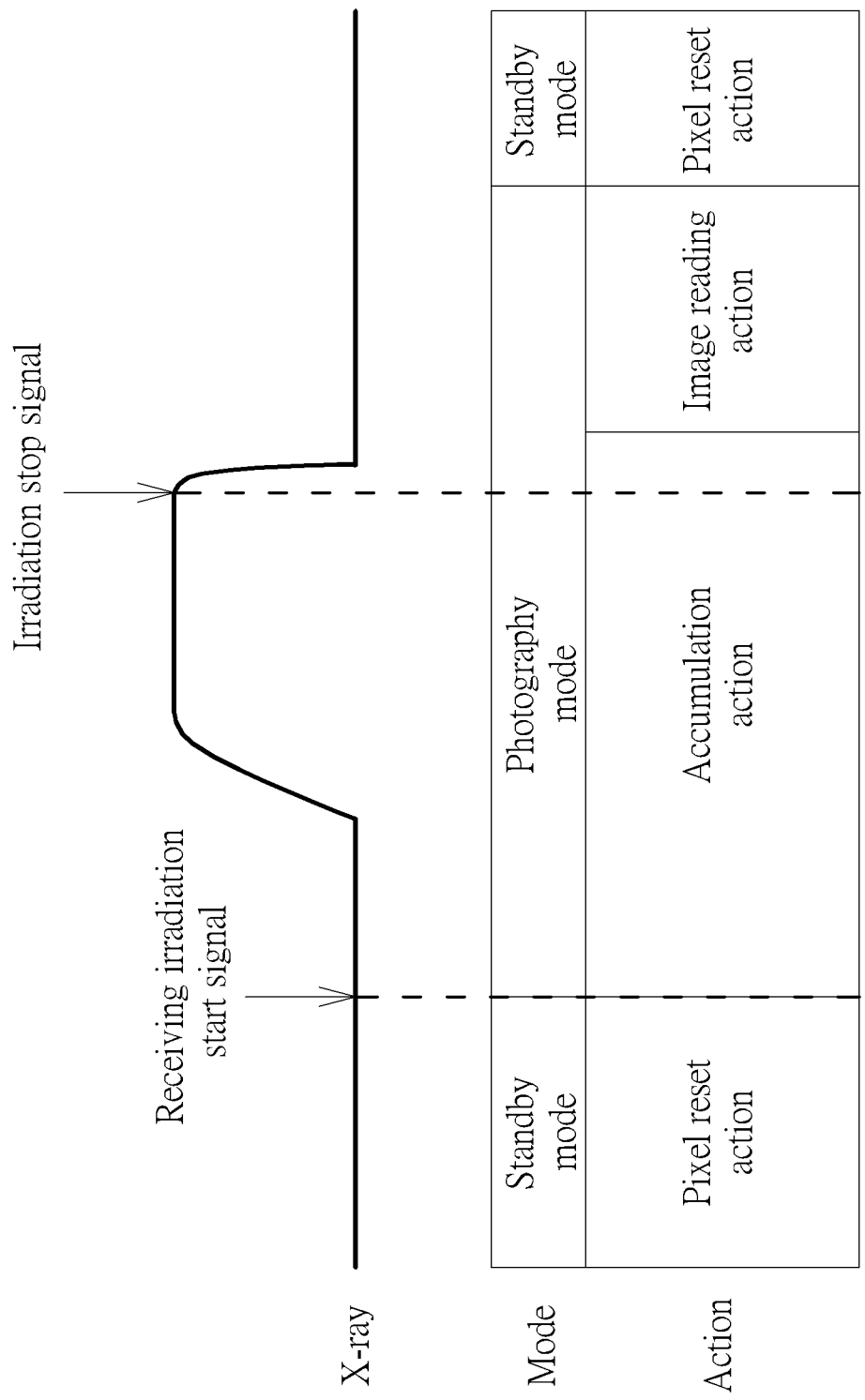
FIG. 4 is a schematic diagram illustrating timings of the radiation system according to an embodiment of the present disclosure.

Please refer to FIG. 1 and FIG. 4. FIG. 4 is a schematic diagram illustrating timings of the radiation system according to an embodiment of the present disclosure. As shown in FIG. 4, an operation method of the radiation sensing device 101 in this embodiment may include the following steps. In some embodiments, the radiation sensing device 101 may enter a standby mode after being powered on, and an irradiation start signal may be transmitted to the radiation sensing device 101 and the radiation generating device 901 by an operator before the formal exposure of the radiation (such as X-ray) by the radiation generating device 901. In other words, the radiation sensing device 101 may enter a photography mode from the standby mode by receiving the irradiation start signal. It is worth noting that the radiation sensing device 101 described is provided, and the radiation sensing device 101 is put into a standby mode. The second gate electrode G2 has a positive bias voltage during the standby mode, and the second gate electrode G2 may be positively biased during the standby mode.

In the photography mode, some of the light sensing units PU may be used to sense the radiation energy and accumulate the received radiation energy, an irradiation stop signal may be received by the radiation generating device 901 for stopping the radiation subsequently, and a comprehensive scan may then be executed by the radiation sensing device 101 for performing an image reading action. Finally, the photography mode may be ended after the image reading action is completed, and the radiation sensing device may return to the standby mode from the photography mode after the image reading action. For example, before the irradiation is finished, the semiconductor unit T may be controlled by the first gate electrode G1 to be closed, and a charge accumulation action may be performed by the light sensing unit T exposed to the radiation. Comparatively, when the image reading action is performed, the semiconductor unit T may be controlled by the first gate electrode G1 to be opened for reading signals from the light sensing unit PU.

In the operation method of the present disclosure, beyond the time between the radiation sensing device 101 receiving the irradiation start signal and completing the image reading action (such as the photography mode shown in FIG. 4), the radiation sensing device 101 may be regarded as being put in the standby mode. In the standby mode, the semiconductor unit T may be controlled by the first gate electrode G1 to be closed, and a pixel reset action may be performed in the light sensing units PU for being ready for the next radiation exposure. It is worth noting that, in the standby node, the second gate electrode G2 may have a positive bias voltage (such as a first voltage V1 shown in FIG. 3(*a*) and FIG. 3(*c*)) for recovering the influence on electrical properties of the semiconductor unit T after the semiconductor unit T is irradiated by the radiation, and the electrical performance of the semiconductor unit T may be recovered to be normal. In some embodiments, there may be not any voltage applied to the second gate electrode G2 during the photography mode described above, but not limited thereto.

Specifically, in some embodiments, by the influence of the energy and/or the dose of the radiation during the irradiation, properties of stacked layers in the semiconductor units T (such as the active layer SC, the gate dielectric layer 12, and/or the protection layer 14) may change, and the electrical performance of the semiconductor switching units may be influenced accordingly. For instance, the energy gap of the active layer SC and the portions of the active layer SC adjacent to other dielectric layers (such as the gate dielectric layer 12 and the protection layer 14) may be influenced by the radiation and bend downward, and negative shift in the threshold voltage (Vth) of the semiconductor unit T may be generated accordingly. However, in the present disclosure, the electrons in the protection layer 14 may accumulate at a side adjacent to the active layer by positively biasing the second gate electrode G2 of the radiation sensing device during the standby mode, and the energy gap of the active layer SC may be recovered to be the normal condition before being irradiated by the radiation. In other words, by positively biasing the second gate electrode G2 for a specific period during the standby mode, the energy gap of the active layer SC may be raised to be normal, positive shift in the threshold voltage of the semiconductor unit T may be generated accordingly, and the threshold voltage of the semiconductor unit T may be recovered to be normal.

For example, in the operation method of this embodiment, the second gate electrode G2 may have a positive bias voltage during the standby mode of the radiation sensing device 101 for performing a recovery treatment, and a treatment time of the recovery treatment may range from 1 minute to 60 minutes, from 5 minutes to 20 minutes, 5 minutes to 10 minutes, or other suitable time ranges. In other words, in some embodiments, the second gate electrode G2 may have a positive bias voltage during a portion of the period of the standby mode of the radiation sensing device 101 for providing the treatment effect described above, but not limited thereto. In some embodiments, the second gate electrode G2 may have a positive bias voltage during the whole period of the standby mode of the radiation sensing device 101. In addition, a signal applied to the second gate electrode G2 during the standby mode may include a DC signal, an AC signal, or signals of other suitable types, and the positive bias voltage applied to the second gate electrode G2 in the recovery treatment may range from 5 volts to 20 volts or other suitable voltage ranges, and that may be adjusted according to design and will not be limited thereto. In some embodiments, there may be not any voltage applied to the first gate electrode G1 during the recovery treatment described above, but not limited thereto. In some embodiments, when the negative shift in the threshold voltage of the semiconductor unit T influenced by the radiation is too significant, the first gate electrode G1 may be positively biased in the recovery treatment described above and/or in the standby mode described above for closing the semiconductor unit T. In other words, the first gate electrode G1 may also have a positive bias voltage in the standby mode, but not limited thereto.

Figure 5:
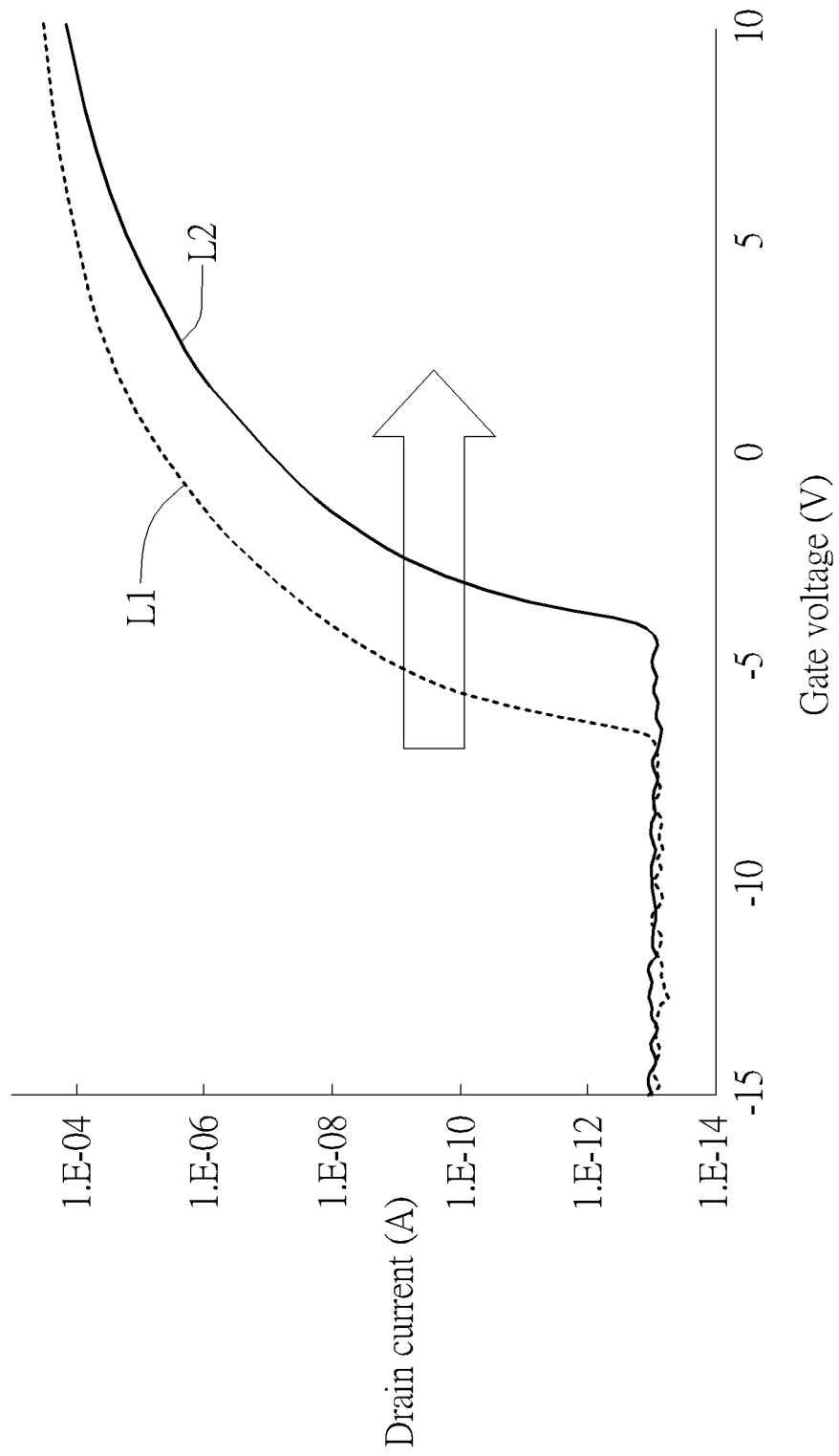
FIG. 5 is a schematic diagram illustrating the relationship between a drain current of a semiconductor unit in the radiation sensing device and a gate voltage of the semiconductor unit according to an embodiment of the present disclosure.

Please refer to FIG. 5. FIG. 5 is a schematic diagram illustrating the relationship between a drain current ($I_D$) of the semiconductor unit T in the radiation sensing device 101 and a gate voltage ($V_G$) of the semiconductor unit T (I-V curve) in this embodiment, wherein a first relation line L1 stands for the I-V curve of the semiconductor unit after being exposed to radiation, and a second relation line L2 stands for the I-V curve of the semiconductor unit after being exposed to radiation and being treated by the recovery treatment described above. From the first relation line L1, it is known that the threshold voltage of the semiconductor unit T is negatively shifted due to the radiation. Then, from the second relation line L2, it is known that the recovery effect may be achieved by the positive bias voltage of the second gate electrode G2 in the standby mode. In other words, the threshold voltage of the semiconductor unit T after the recovery treatment may be higher than the threshold voltage of the semiconductor unit T before the recovery treatment.

By the radiation sensing device 101 and the operation method thereof in the present disclosure, the influence of the radiation on the electrical properties of the semiconductor unit T may be recovered, the electrical performance of the semiconductor unit T may be recovered to be normal, the influence of the radiation exposure on the normal operation of the radiation sensing device 101 may be avoided, and the lifetime of the radiation sensing device 101 may be extended accordingly. For example, in some embodiments, the negative shift in the threshold voltage may be recovered with about 1 volt by modifying the manufacturing processes of the stacked layers (such as the active layer SC, the gate dielectric layer 12, and/or the protection layer 14), and the negative shift in the threshold voltage may be recovered with about 4 volts by the method of positively biasing the second gate electrode G2 in the present disclosure without modifying the process conditions of each of the stacked layers. Other negative influence of modifying the process conditions of each of the stacked layers (such as negative influence on the stability and/or the reliability) may be avoided accordingly.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 6:
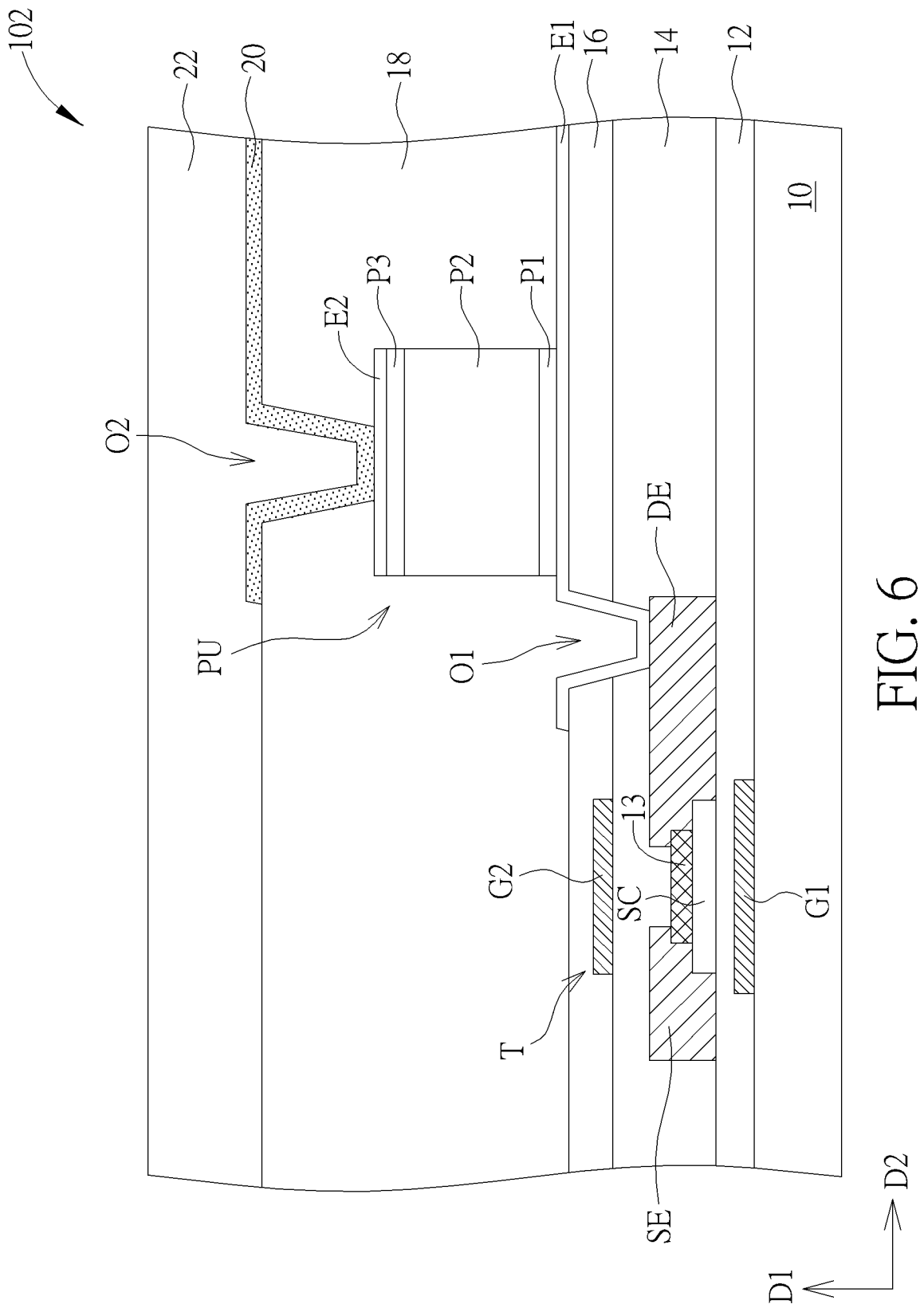
FIG. 6 is a schematic diagram illustrating a radiation sensing device according to an exemplary example of the first embodiment of the present disclosure.

Please refer to FIG. 6. FIG. 6 is a schematic diagram illustrating a radiation sensing device 102 according to an exemplary example of the first embodiment of the present disclosure. As shown in FIG. 6, the radiation sensing device 102 may further include an insulation layer 13 disposed on the active layer SC, and the source electrode SE and the drain electrode DE may be disposed on the insulation layer 13. In this embodiment, the insulation layer 13 may be called an etching stop layer configured to protect the active layer SC during the manufacturing process of forming the source electrode SE and the drain electrode DE.

Figure 7:
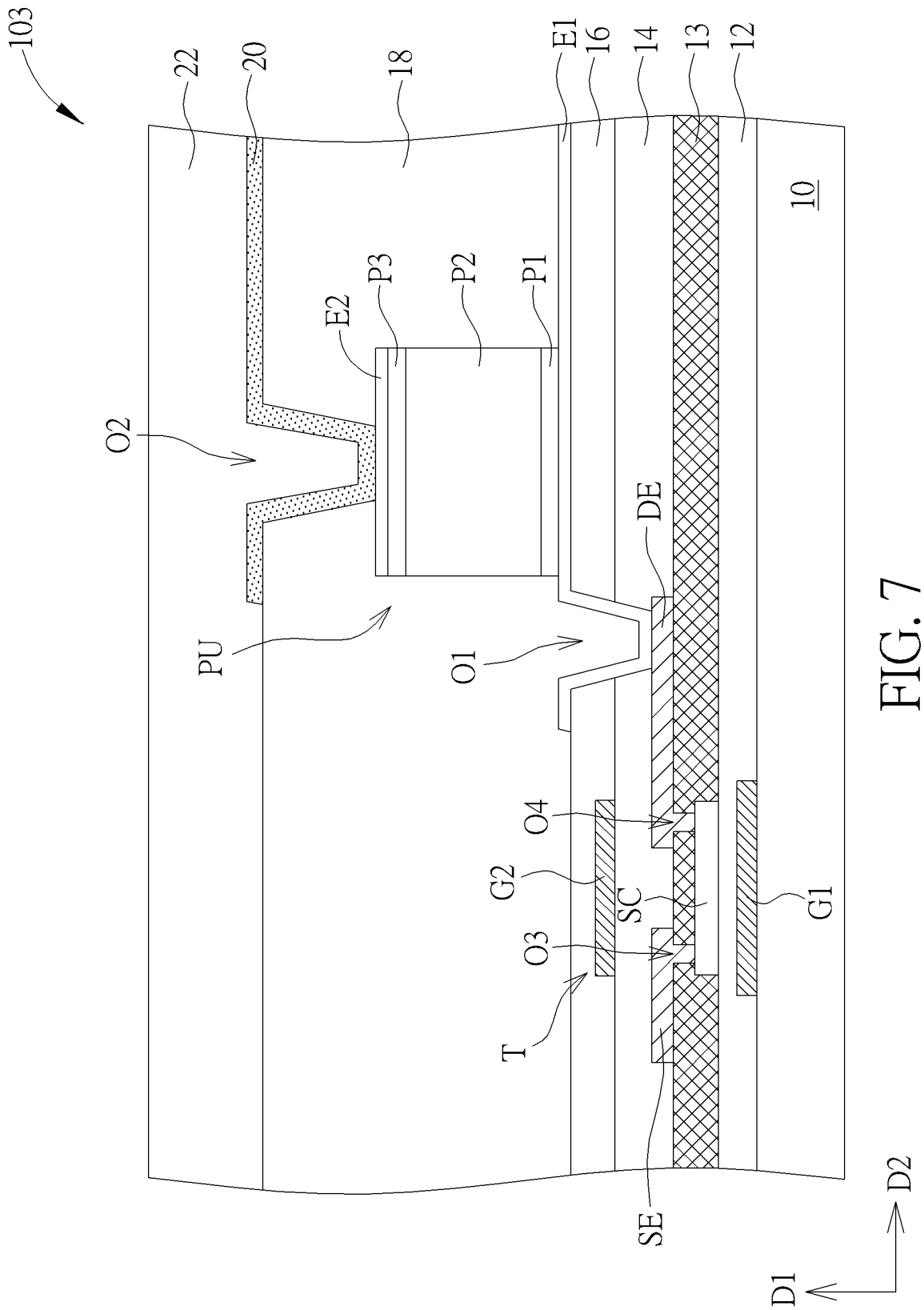
FIG. 7 is a schematic diagram illustrating a radiation sensing device according to another exemplary example of the first embodiment of the present disclosure.

Please refer to FIG. 7. FIG. 7 is a schematic diagram illustrating a radiation sensing device 103 according to another exemplary example of the first embodiment of the present disclosure. As shown in FIG. 7, the insulation layer 13 may be further sandwiched between the source electrode SE and the active layer SC and between the drain electrode DE and the active layer SC. The insulation layer 13 may have a first opening (such as an opening O3) and a second opening (such as an opening O4). The source electrode SE and the drain electrode DE may be electrically connected with the active layer via the opening O3 and the opening O4 respectively, and the opening O3 and the opening O4 may be formed with sidewalls of the insulation layer 13 located above the active layer SC, but not limited thereto.

Figure 8:
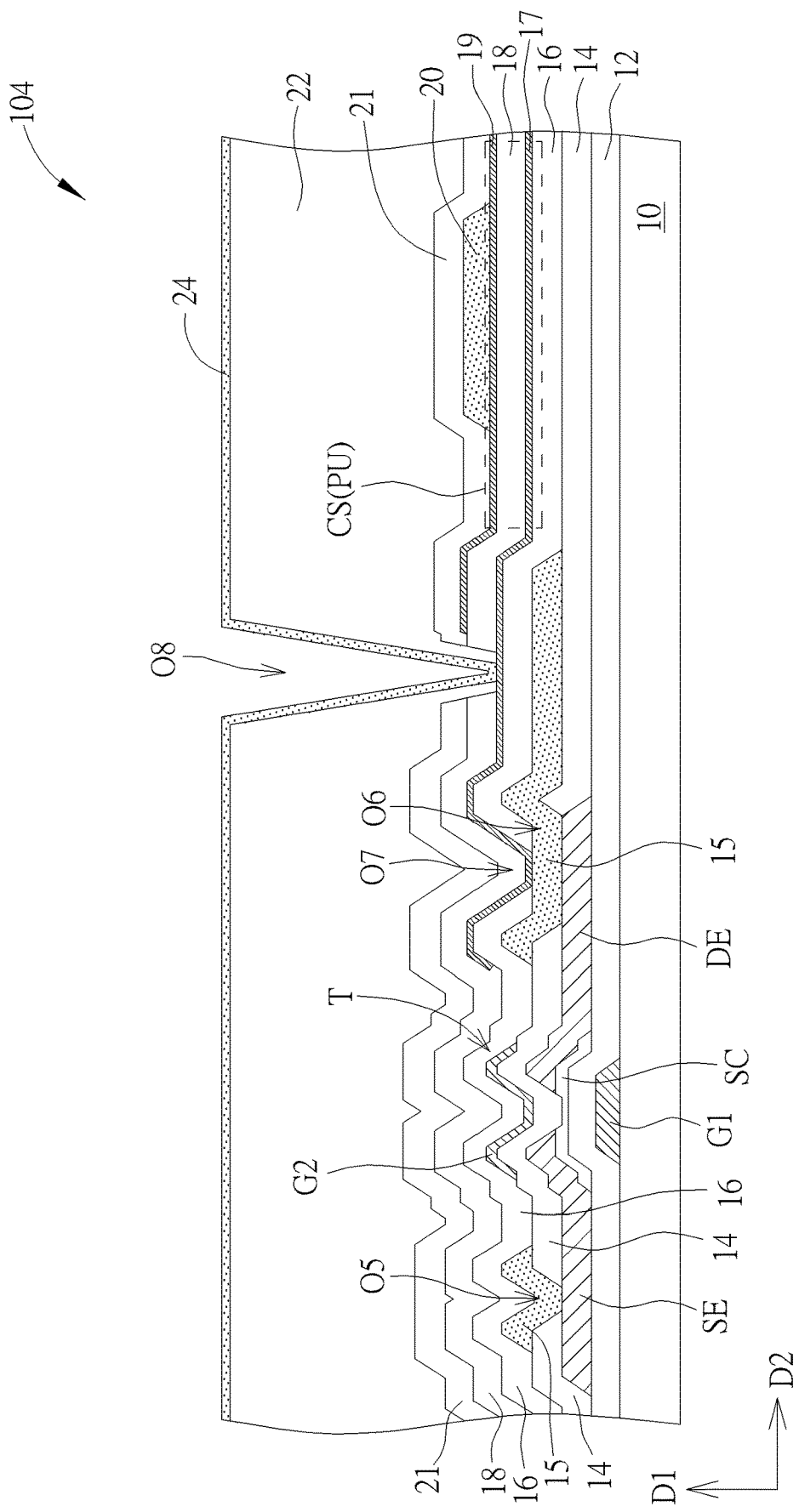
FIG. 8 is a schematic diagram illustrating a radiation sensing device according to a second embodiment of the present disclosure.
Figure 9:
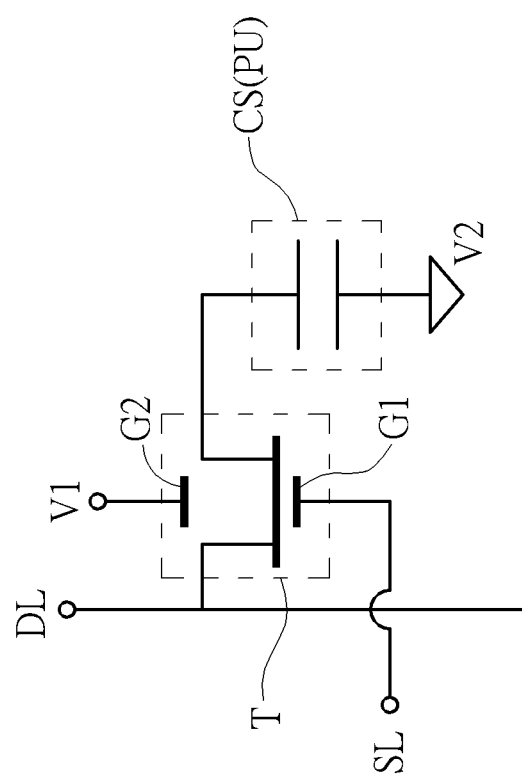
FIG. 9 is a schematic circuit diagram of a part of the radiation sensing device according to the second embodiment of the present disclosure.

Please refer to FIG. 8 and FIG. 9. FIG. 8 is a schematic diagram illustrating a radiation sensing device 104 according to a second embodiment of the present disclosure, and FIG. 9 is a schematic circuit diagram of a part of the radiation sensing device 104 in the second embodiment. As shown in FIG. 8 and FIG. 9, in the radiation sensing device 104, the light sensing unit PU may include a capacitor structure CS optionally, and the capacitor structure CS may be formed with two electrically conductive layers and a dielectric material sandwiched between the two electrically conductive layers, such as being formed with a fourth electrically conductive layer 17, a fifth electrically conductive layer 19, and the second insulation layer 18, but not limited thereto. In addition, the radiation sensing device 104 may further include a third electrically conductive layer 15, a fourth insulation layer 21, and a second electrically conductive layer 24. The third electrically conductive layer 15 may be disposed on the protection layer 14, and the first insulation layer 16 may be disposed on the third electrically conductive layer 15. The third electrically conductive layer 15 may be electrically connected with the source electrode SE via an opening O5 and electrically connected with the drain electrode DE via an opening O6. The opening O5 and the opening O6 may be formed with sidewalls of the protection layer 14 above the source electrode SE and the drain electrode DE. The fourth electrically conductive layer 17 described above may be disposed on the first insulation layer 16, and the fourth electrically conductive layer 17 may contact the third electrically conductive layer 15 via an opening O7 penetrating the first insulation layer 16 above the third electrically conductive layer 15. In other words, the fourth electrically conductive layer 17 may be electrically connected with the drain electrode DE of the semiconductor unit T via the third electrically conductive layer 15, but not limited thereto. The fifth electrically conductive layer 19 may be disposed on the second insulation layer 18, and the first electrically conductive layer 20 may be disposed on and electrically connected with the fifth electrically conductive layer 19 for applying a reference voltage (such as a second voltage V2 shown in FIG. 9) to the fifth electrically conductive layer 19.

In addition, the fourth insulation layer 21 may be disposed on the first electrically conductive layer 20, the fifth electrically conductive layer 19, and the second insulation layer 18. The third insulation layer 22 may be disposed on the fourth insulation layer 21. The second electrically conductive layer 24 may be disposed on the third insulation layer 22. The second electrically conductive layer 24 may be electrically connected with the fourth electrically conductive layer 17 via an opening O8, and the opening O8 may be formed with the sidewalls of the second insulation layer 18, the fourth insulation layer 21, and the third insulation layer 22 above the fourth electrically conductive layer 17, but not limited thereto. It is worth noting that, the capacitor structure CS and specific material (such as selenium or other suitable materials) disposed on the capacitor structure CS are used for sensing in this embodiment. A scintillator layer (not shown) may be used for the photodiode in the above-mentioned embodiments and converting radiation into visible light, and light sensing may then be performed by the photodiode accordingly, but not limited thereto.

To summarize the above descriptions, in the radiation sensing device and the operation method thereof in the present disclosure, the second gate electrode may have a positive bias voltage during the standby mode for recovering the influence of the radiation on the electrical properties of the semiconductor unit, and the electrical performance of the semiconductor unit may be recovered to be normal. The influence of the radiation exposure on the normal operation of the radiation sensing device may be avoided, and the lifetime of the radiation sensing device may be extended accordingly.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A radiation sensing device, comprising:
a substrate;
a plurality of semiconductor units disposed on the substrate, wherein at least one of the semiconductor units comprises:
a first gate electrode;
an active layer disposed on the first gate electrode; and
a second gate electrode disposed on the active layer, wherein the second gate electrode has a positive bias voltage during a standby mode, and there is not any voltage applied to the first gate electrode during the standby mode; and
at least one light sensing unit disposed on the substrate, wherein the at least one light sensing unit is not electrically connected with the second gate electrode.

2. The radiation sensing device according to claim 1, wherein the at least one light sensing unit comprises:
a first semiconductor layer;
an intrinsic semiconductor layer; and
a second semiconductor layer, wherein the intrinsic semiconductor layer is sandwiched between the first semiconductor layer and the second semiconductor layer.

3. The radiation sensing device according to claim 2, wherein the at least one of the semiconductor units further comprises a source electrode and a drain electrode, wherein one of the source electrode or the drain electrode is electrically connected with the first semiconductor layer, the first semiconductor layer is a P-type semiconductor layer, and the second semiconductor layer is an N-type semiconductor layer.

4. The radiation sensing device according to claim 2, wherein the at least one of the semiconductor units further comprises a source electrode and a drain electrode, wherein one of the source electrode or the drain electrode is electrically connected with the first semiconductor layer, the first semiconductor layer is an N-type semiconductor layer, and the second semiconductor layer is a P-type semiconductor layer.

5. The radiation sensing device according to claim 1, wherein the at least one light sensing unit is electrically connected with the at least one of the semiconductor units, and the at least one light sensing unit comprises a capacitor structure.

6. The radiation sensing device according to claim 1, further comprising:
an insulation layer disposed on the active layer.

7. The radiation sensing device according to claim 6, wherein the insulation layer has a first opening and a second opening, and the at least one of the semiconductor units further comprises a source electrode and a drain electrode, wherein the source electrode is electrically connected with the active layer via the first opening, and the drain electrode is electrically connected with the active layer via the second opening.

* * * * *